(12) United States Patent
Urata

(10) Patent No.: US 12,113,513 B2
(45) Date of Patent: Oct. 8, 2024

(54) FILTER AND MULTI-FILTER

(71) Applicant: KYOCERA Corporation, Kyoto (JP)

(72) Inventor: Tomonori Urata, Kyotanabe (JP)

(73) Assignee: KYOCERA Corporation, Kyoto (JP)

( * ) Notice: Subject to any disclaimer, the term of this patent is extended or adjusted under 35 U.S.C. 154(b) by 396 days.

(21) Appl. No.: 17/434,094

(22) PCT Filed: Feb. 18, 2020

(86) PCT No.: PCT/JP2020/006261
§ 371 (c)(1),
(2) Date: Aug. 26, 2021

(87) PCT Pub. No.: WO2020/175240
PCT Pub. Date: Sep. 3, 2020

(65) Prior Publication Data
US 2022/0140816 A1    May 5, 2022

(30) Foreign Application Priority Data

Feb. 26, 2019 (JP) .................................. 2019-032368

(51) Int. Cl.
*H03H 9/56* (2006.01)
*H03H 9/13* (2006.01)
*H03H 9/17* (2006.01)

(52) U.S. Cl.
CPC .............. *H03H 9/568* (2013.01); *H03H 9/13* (2013.01); *H03H 9/17* (2013.01)

(58) Field of Classification Search
CPC ............ H03H 9/568; H03H 9/13; H03H 9/17; H03H 9/02559; H03H 9/6436; H03H 9/6483; H03H 9/725; H03H 9/02574
See application file for complete search history.

(56) References Cited

U.S. PATENT DOCUMENTS

| | | | |
|---|---|---|---|
| 10,135,422 B2 | 11/2018 | Goto et al. | |
| 2005/0151600 A1* | 7/2005 | Takeuchi | H03H 9/174 333/191 |
| 2007/0013459 A1* | 1/2007 | Mimura | H03H 9/6466 333/195 |
| 2008/0246557 A1 | 10/2008 | Kiwitt et al. | |
| 2016/0173062 A1 | 6/2016 | Takamine | |
| 2017/0099043 A1 | 4/2017 | Goto et al. | |
| 2018/0123556 A1 | 5/2018 | Takamine | |
| 2018/0241373 A1 | 8/2018 | Yamada | |
| 2020/0028486 A1 | 1/2020 | Kishino et al. | |
| 2020/0127634 A1 | 4/2020 | Kurimoto et al. | |

FOREIGN PATENT DOCUMENTS

| | | |
|---|---|---|
| JP | 2009-509429 A | 3/2009 |
| JP | 5765502 B1 | 8/2015 |
| JP | 2017-092945 A | 5/2017 |
| JP | 2019-004308 A | 1/2019 |
| WO | 2016/208447 A1 | 12/2016 |
| WO | 2017/073652 A1 | 5/2017 |
| WO | 2018/151147 A1 | 8/2018 |

* cited by examiner

*Primary Examiner* — Andrea Lindgren Baltzell
*Assistant Examiner* — Kimberly E Glenn
(74) *Attorney, Agent, or Firm* — Volpe Koenig

(57) ABSTRACT

A filter includes a ladder filter portion formed on a first piezoelectric substrate; and a multi-mode filter portion connected to the ladder filter portion and formed on a second piezoelectric substrate different from the first piezoelectric substrate. The ladder filter portion and the multi-mode filter portion constitute a single passband.

20 Claims, 5 Drawing Sheets

FILTER AND MULTI-FILTER

FIELD OF INVENTION

The present disclosure relates to a filter that uses an elastic wave and to a multi-filter including the filter.

TECHNICAL BACKGROUND

There is known an elastic wave device that applies a voltage to an IDT (interdigital transducer) electrode on a piezoelectric body to produce an elastic wave that propagates through the piezoelectric body. For example, a ladder filter and a multi-mode filter are known as filters that use such IDT electrodes.

PTL 1 discloses an example in which a combination of a ladder filter portion and a multi-mode filter portion serves as a reception filter. These ladder filter portion and multi-mode filter portion are formed on the same substrate.

CITATION LIST

Patent Literature

PTL 1: Japanese Patent No. 5765502

SUMMARY

A filter according to an aspect of the present disclosure is a filter including a ladder filter portion formed on a first piezoelectric substrate, and a multi-mode filter portion connected to the ladder filter portion and formed on a second piezoelectric substrate different from the first piezoelectric substrate, in which the ladder filter portion and the multi-mode filter portion constitute a single passband.

A multi-filter according to an aspect of the present disclosure is a multi-filter including a first filter as which the above-described filter is used, a second filter, and a third filter, in which a center frequency of a passband of the first filter takes a value between center frequencies of the second filter and the third filter, and the first substrate or the second substrate is shared with the second filter or the third filter.

DETAILED DESCRIPTION

A specific embodiment of a technique according to the present disclosure will be described below with reference to the drawings to clarify the technique according to the present disclosure.

[Filter 1]

Figure 1:
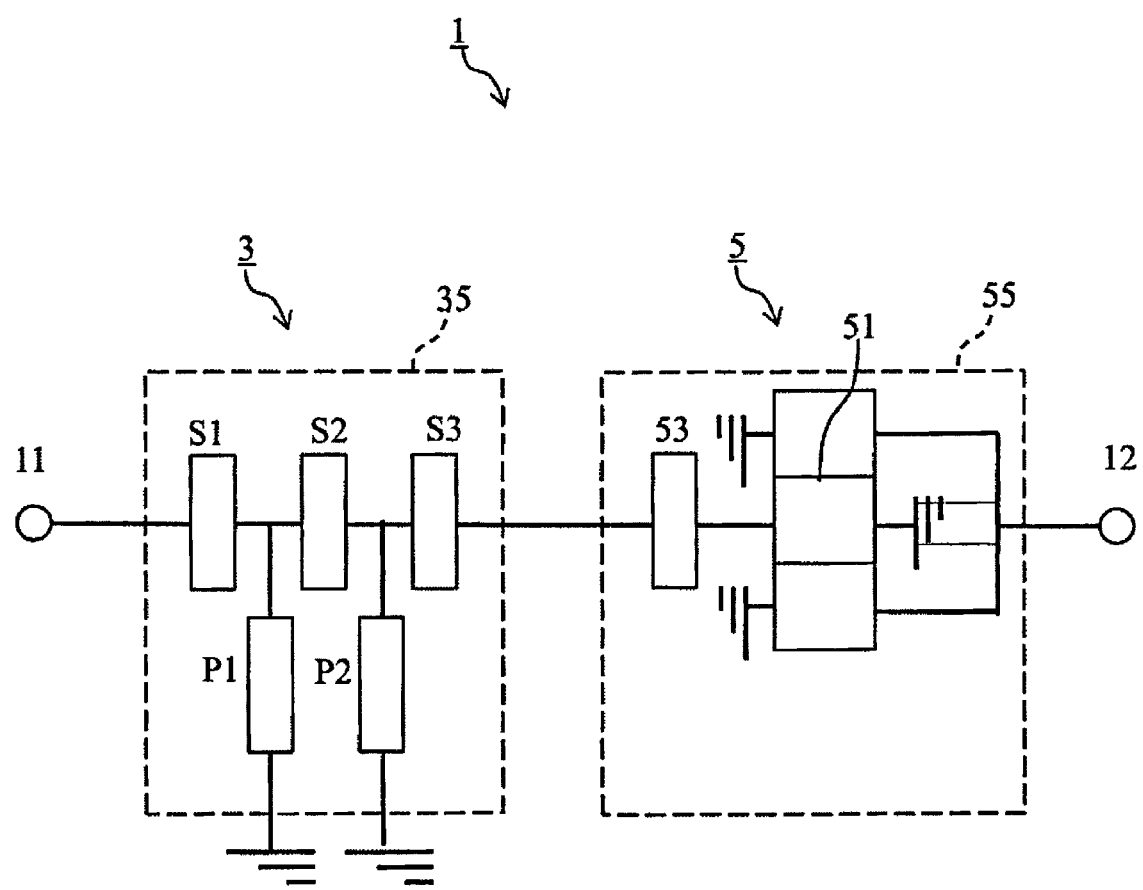
FIG. 1 is a diagram illustrating a schematic configuration of a filter according to an embodiment.
Figure 2A:
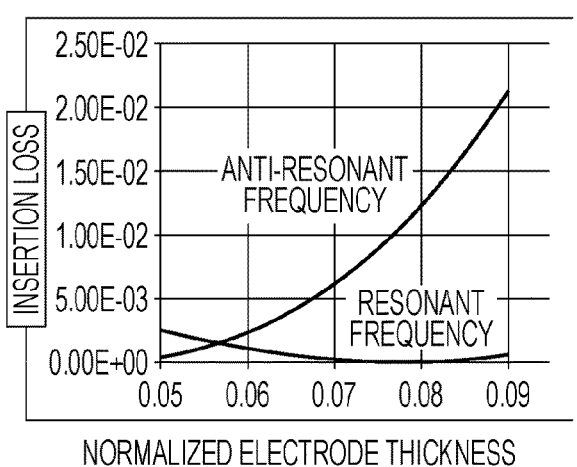
FIG. 2A to FIG. 2D are graphs each depicting a correlation between an electrode thickness and electrical characteristics.
Figure 2B:
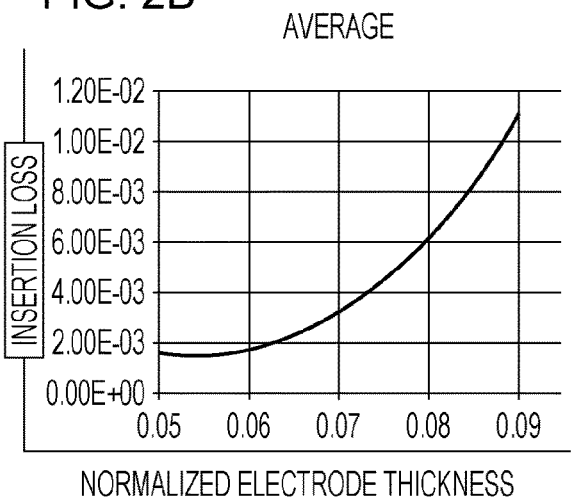
Figure 2C:
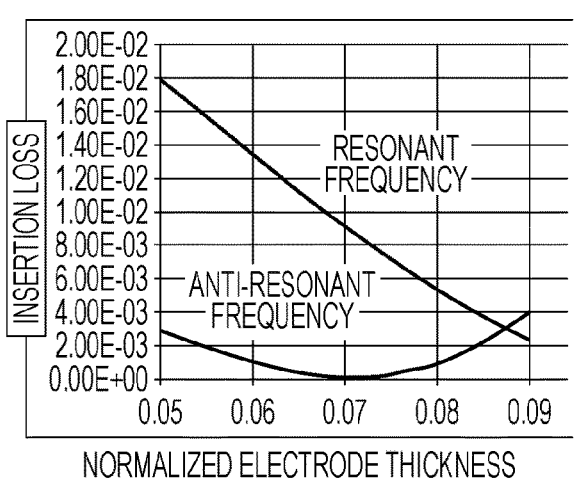
Figure 2D:
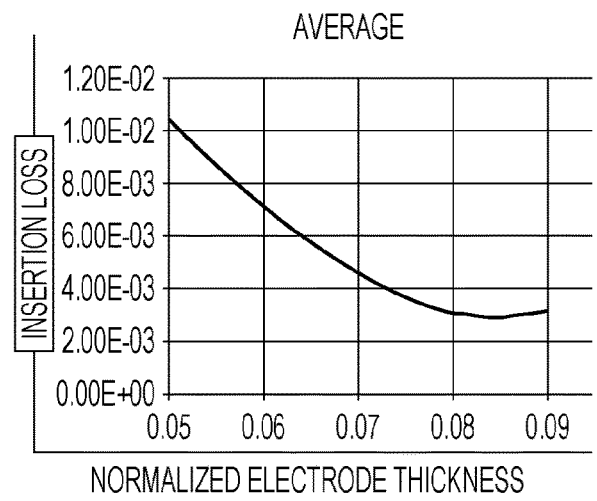

FIG. 1 is a schematic diagram of a filter 1. The filter 1 includes a ladder filter portion 3 and a multi-mode filter portion 5 between terminals 11 and 12. In this example, the ladder filter portion 3 and the multi-mode filter portion 5 are connected in series with each other to form a single passband.

The ladder filter portion 3 includes series resonators S1 to S3 connected in series with each other, and parallel resonators P1 and P2 connected in parallel with each other between a reference potential and these series resonators S1 to S3. It is sufficient that series resonators S and parallel resonators P are connected in a ladder form in the ladder filter portion 3. Thus, the numbers of resonators, the size of each resonator, etc. can be flexibly selected as appropriate in accordance with desired characteristics.

The multi-mode filter portion 5 includes a DMS (Double Mode SAW) filter 51 in this example. In this example, the DMS filter 51 is an unbalanced filter. However, the DMS filter 51 may be a filter having a balanced-unbalanced transforming function. A plurality of DMS filters 51 may be included, or a resonator 53, an inductance, or the like may be connected at a preceding or subsequent stage of the DMS filter 51.

Each of the filter portions applies a voltage to an IDT (interdigital transducer) electrode on a piezoelectric substrate to produce an elastic wave that propagates through the piezoelectric body. In this manner, each of the filter portions exhibits filter characteristics. The IDT electrode is formed by patterning a conductor layer (metal layer) and is made of Al or an Al alloy, for example. The IDT electrode may be constituted by a multi-layer body obtained by stacking a plurality of different conductor layers.

Such an IDT electrode includes a pair of comb-teeth electrodes. The pair of comb-teeth electrodes each have a plurality of electrode fingers (which correspond to teeth of a comb) and are disposed to interdigitate with each other. A standing wave of an elastic wave having a wavelength $\lambda$ that is twice a pitch p of these electrode fingers is formed, and the frequency of this standing wave serves as a resonant frequency. A passband of the ladder filter portion 3 is formed based on a resonant frequency and an anti-resonant frequency. A passband of the multi-mode filter portion 5 is formed based on a resonant frequency.

The filter 1 includes the ladder filter portion 3 and the multi-mode filter portion 5 in this manner, so that the filter 1 can be a filter having advantages of both of the filters. That is, the filter 1 can have a wide band and good attenuation characteristics.

To further improve the characteristics of such a filter 1, the ladder filter portion 3 and the multi-mode filter portion 5 are formed on separate piezoelectric substrates in the filter 1 according to the present disclosure. Specifically, the ladder filter portion 3 is formed on a first piezoelectric substrate 35, and the multi-mode filter portion 5 is formed on a second piezoelectric substrate 55. A portion formed on the same piezoelectric substrate is surrounded by a broken line in FIG. 1. It is sufficient that the first piezoelectric substrate 35 and the second piezoelectric substrate 55 are separate from each other. In addition to that, the first piezoelectric substrate 35 and the second piezoelectric substrate 55 may be different from each other in any of a material, a cut-angle, or a film thickness.

FIG. 2 depicts a relationship between an electrode thickness and a loss of a resonator when a lithium tantalate substrate (hereinafter, referred to as an LT substrate) is used. FIGS. 2A and 2B depict simulation results obtained when an LT substrate having a cut-angle of 42° is used as a piezoelectric substrate, and FIGS. 2C and 2D depict simulation results obtained when an LT substrate having a cut-angle of 46° is used as a piezoelectric substrate. FIGS. 2A and 2C are graphs each depicting correlations between an electrode thickness and losses at the resonant frequency and the anti-resonant frequency. FIGS. 2B and 2D are graphs each depicting a correlation between the electrode thickness and an average value of the losses at the resonant frequency and the anti-resonant frequency. In each graph, the horizontal axis represents the electrode thickness (unit: λ), and the vertical axis represents the loss (unit: dB).

As is apparent from FIG. 2, the electrode thickness that gives the smallest loss differs between the resonant frequency and the anti-resonant frequency, and also changes when the cut-angle changes. For the ladder filter portion 3, the electrode thickness that gives the smallest average value of the losses at the resonant frequency and the anti-resonant frequency is selected such that the losses become small at both the resonant frequency and the anti-resonant frequency that form the passband. On the other hand, for the multi-mode filter portion 5, the electrode thickness is selected such that the loss becomes small at the resonant frequency that forms the passband. Thus, to enhance the characteristics of both the filter portions, the optimum electrode thickness differs between the filter portions. However, to implement this with a single substrate, electrodes having a plurality of film thicknesses need to be formed on the same substrate. This may reduce the productivity. In contrast, according to the present disclosure, the filter portions 3 and 5 are formed on different substrates. Thus, the electrode thickness can be made different between the filter portions 3 and 5 without complicating a fabrication process. Consequently, the filter 1 with a high productivity can be provided.

As the electrode thickness increases, the resistance value of a wiring decreases. Thus, by increasing the electrode thickness within a range that is not below a reduction in the loss in the resonance characteristics resulting from the optimum thickness, the insertion loss can be improved. This tendency is substantially the same also when the cut-angle of the piezoelectric substrate changes. Therefore, to increase the electrode thickness of the ladder filter portion 3, the cut-angle of the piezoelectric substrate (the first piezoelectric substrate 35) on which the ladder filter portion 3 is disposed may be increased. In such a case, the cut-angle of the first piezoelectric substrate 35 may be made larger than the cut-angle of the second piezoelectric substrate 55. For example, a 46°-to-50° Y-X-cut LT substrate may be used as the first piezoelectric substrate 35, and a 41°-to-43° Y-X-cut LT substrate may be used as the second piezoelectric substrate 55.

Note that in a ladder filter, the insertion loss or the sharpness deteriorates if a stopband located on a higher frequency side of the anti-resonant frequency is located within or near the passband. If the electrode film thickness is increased and the pitch of the electrode fingers of the IDT electrodes is changed, the stopband can be moved to the higher frequency side. Also from this perspective, the cut-angle of the first piezoelectric substrate 35 used for the ladder filter portion 3 may be made larger than that of the second piezoelectric substrate 55 to increase the electrode film thickness. By using this method, the deterioration in the insertion loss or the sharpness of the ladder filter can be reduced. As for this tendency, substantially the same tendency can be confirmed also when the cut-angle of the piezoelectric substrate changes.

As described above, electrical characteristics of the ladder filter portion 3 may be adjusted by increasing the electrode thickness. Thus, to increase the electrode thickness, the cut-angle of the piezoelectric substrate (the first piezoelectric substrate 35) on which the ladder filter portion 3 is disposed may be increased. In such a case, the cut-angle of the first piezoelectric substrate 35 may be made larger than the cut-angle of the second piezoelectric substrate 55. For example, a 46°-to-50° Y-X-cut LT substrate may be used as the first piezoelectric substrate 35, and a 41°-to-43° Y-X-cut LT substrate may be used as the second piezoelectric substrate 55.

By forming the ladder filter portion 3 and the multi-mode filter portion 5 on separate piezoelectric substrates in this manner, characteristics of the individual filter portions 3 and 5 can be enhanced. As a result, the filter 1 having good electrical characteristics can be provided.

The ladder filter portion 3 and the multi-mode filter portion 5 may be electrically connected to each other by a wiring of a mount substrate on which the first piezoelectric substrate 35 and the second piezoelectric substrate 55 respectively having the ladder filter portion 3 and the multi-mode filter portion 5 are mounted.

[Multi-Filter 100]

Figure 3:
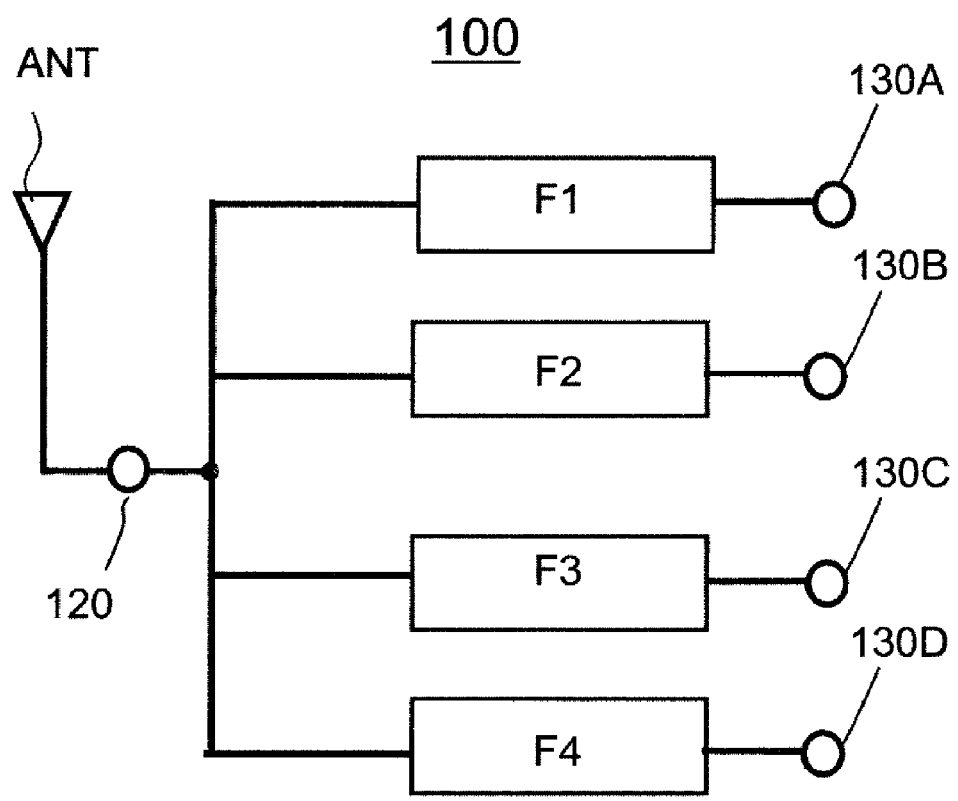
FIG. 3 is a block diagram illustrating a schematic configuration of a multi-filter according to the embodiment.
Figure 4:
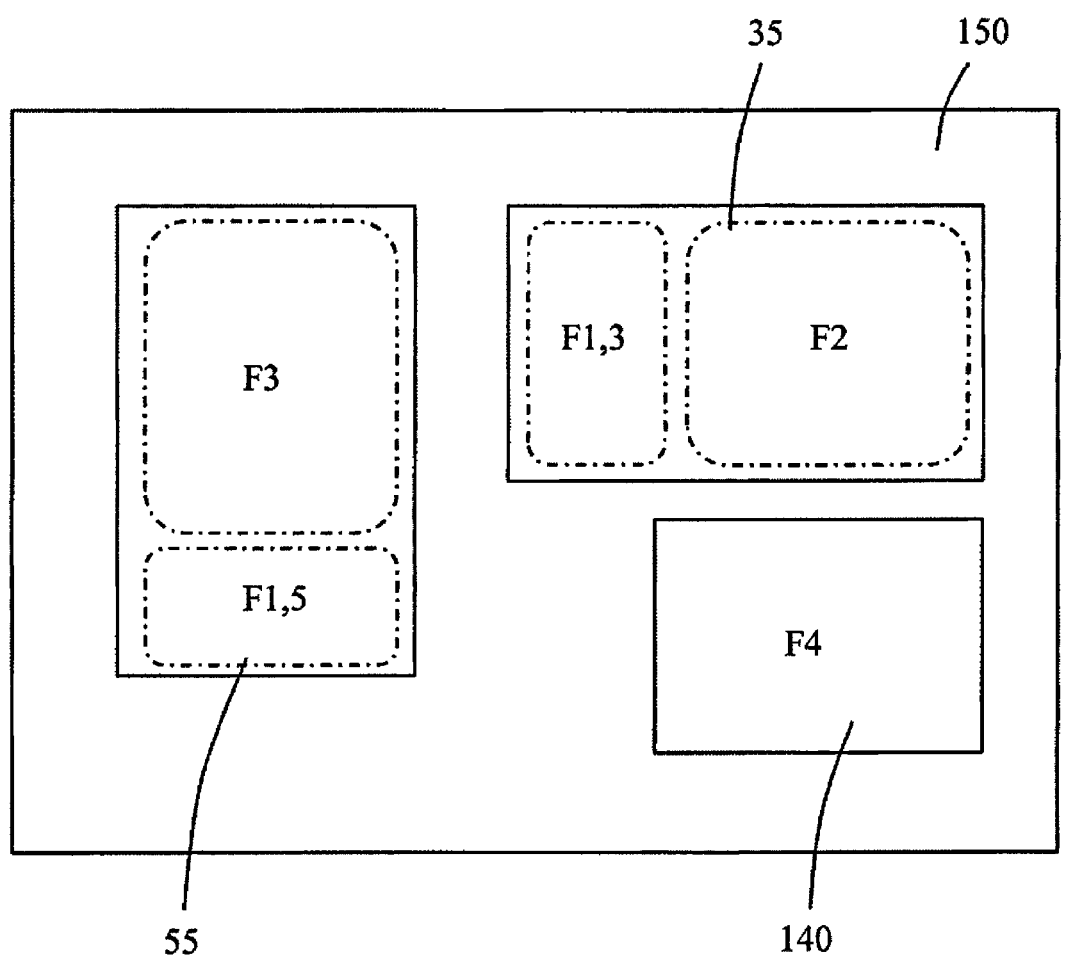
FIG. 4 is a top view of the multi-filter illustrated in FIG. 3.

FIG. 3 is a circuit diagram illustrating an example of a multi-filter 100 according to the present disclosure. FIG. 4 is a schematic top view of the multi-filter 1 illustrated in FIG. 3.

The multi-filter 100 includes an antenna terminal 120, input/output terminals 130A to 130D, and a first filter F1 to a fourth filter F4 having passbands different from each other. In each of four paths between the antenna terminal 120 and the individual input/output terminals 130, a corresponding one of the first filter F1 to the fourth filter F4 is connected. In other words, the multi-filter 100 is a so-called multiplexer in which the first filter F1 to the fourth filter F4 are connected in common to the antenna terminal 120 in parallel with each other.

Let f1, f2, f3, and f4 respectively denote center frequencies of passbands of the first filter F1 to the fourth filter F4. Then, the center frequency f1 takes a value other than the largest and smallest values among these. In this example, a relationship of f2<f1<f4<f3 is satisfied.

Although filter types of the first filter F1 to the fourth filter F4 are not particularly limited, band-pass filters using an elastic wave may be used. In this example, the first filter F1 and the second filter F2 constitute a reception filter and a transmission filter of a single band, and the third filter F3 and the fourth filter F4 constitute a reception filter and a transmission filter of another band.

The filter 1 illustrated in FIG. 1 is used as the first filter F1. Specifically, the first terminal 11 of the filter 1 is electrically connected to the antenna terminal 120, and the second terminal 12 of the filter 1 is electrically connected to the input/output terminal 130A.

The second filter F2 and the fourth filter F4 are transmission filters each constituted by a ladder filter. The third filter F3 is a reception filter constituted by a combination of a ladder filter and a longitudinally coupled (DMS) filter. In this example, the third filter F3 has substantially the same configuration as the first filter F1. However, the third filter F3 may be constituted by a ladder filter alone, or may be constituted by a DMS filter alone or by a DMS filter and a resonator alone without including a ladder filter.

Among the first filter F1 to the fourth filter F4, the first filter F1 is formed on two substrates in a divided manner and share these separate substrates with any of the other filters F2 to F4. Specifically, as illustrated in FIG. 4, the ladder filter portion 3 of the first filter F1 is formed on a single substrate along with the second filter F2. That is, a group of resonators constituting the ladder filter portion 3 and the second filter F2 is formed on the first piezoelectric substrate 35. The first piezoelectric substrate 35 is a 46° Y-X-cut LT substrate, and a thickness of the conductor layer of the group of resonators constituting the ladder filter portion 3 and the second filter F2 is equal to 1960 Å.

Likewise, the multi-mode filter portion 5 of the first filter F1 is formed on a single substrate along with the third filter F3. That is, a group of resonators constituting the multi-mode filter portion 5 and the third filter F3 is formed on the second piezoelectric substrate 55. The second piezoelectric substrate 55 is a 42° Y-X-cut LT substrate, and a thickness of the conductor layer of the group of resonators constituting the multi-mode filter portion 5 and the third filter F3 is equal to 1400 Å.

The fourth filter F4 is formed on another piezoelectric substrate 140 different from the first piezoelectric substrate 35 and the second piezoelectric substrate 55. Similarly to the second piezoelectric substrate 55, a 46° Y-X-cut LT substrate is used as the piezoelectric substrate 140. A thickness of the conductor layer of the group of resonators constituting the fourth filter F4 is equal to 1500 Å.

The first piezoelectric substrate 35, the second piezoelectric substrate 55, and the piezoelectric substrate 140 are mounted on a mount substrate 150, and the filters thereon are electrically connected to each other by a wiring formed on or in the mount substrate 150. In this manner, the multi-filter 100 can be provided. The first piezoelectric substrate 35, the second piezoelectric substrate 55, and the piezoelectric substrate 140 are formed so that surfaces having the electrodes for the filters face the mount substrate 150. A region surrounded by a dot-dash line in FIG. 4 denotes a region where electrodes for each filter are formed on each piezoelectric substrate.

Such a configuration enables four filters to be implemented with three chips (three piezoelectric substrates) and thus can decrease the size of the multi-filter 100. When a single filter is formed on two substrates in a divided manner, the sizes of the individual substrates decrease, making it difficult to handle such substrates. However, since each of the substrates is shared with another filter as described above, the size of each chip can be maintained and the multi-filter 100 that is easy-to-handle and yields a high productivity can be provided.

In this example, ladder filters of the first to fourth filters F1 to F4 are collectively formed on the same substrate, and DMS filters of the first to fourth filters F1 to F4 are collectively formed on the same substrate. This enables selection of the electrode layer thicknesses and piezoelectric substrates that are optimum for the individual filters. Consequently, the electrical characteristics of the individual filters can be enhanced.

In this example, the group of resonators constituting the second filter F2 is formed on the first piezoelectric substrate 35 on which the ladder filter portion 3 is formed. However, the group of resonators constituting the fourth filter F4 may be formed. Alternatively, the group of resonators constituting the second filter F2 and the group of resonators constituting the fourth filter F4 may be formed on the first piezoelectric substrate 35.

In this example, the ladder filters are collectively disposed on the first piezoelectric substrate 35, and the DMS filters are collectively disposed on the second piezoelectric substrate 55. This enables selection of the electrode thickness and substrate that are optimum for each filter type. In this example, the third filter F3 is also a filter in which a combination of a ladder filter and a DMS filter constitute a single passband. The DMS filter portion of the third filter F3 alone may be located on the second piezoelectric substrate 55, and the ladder filter portion thereof may be located on the first piezoelectric substrate 35 or the piezoelectric substrate 140.

Modification

Figure 5:
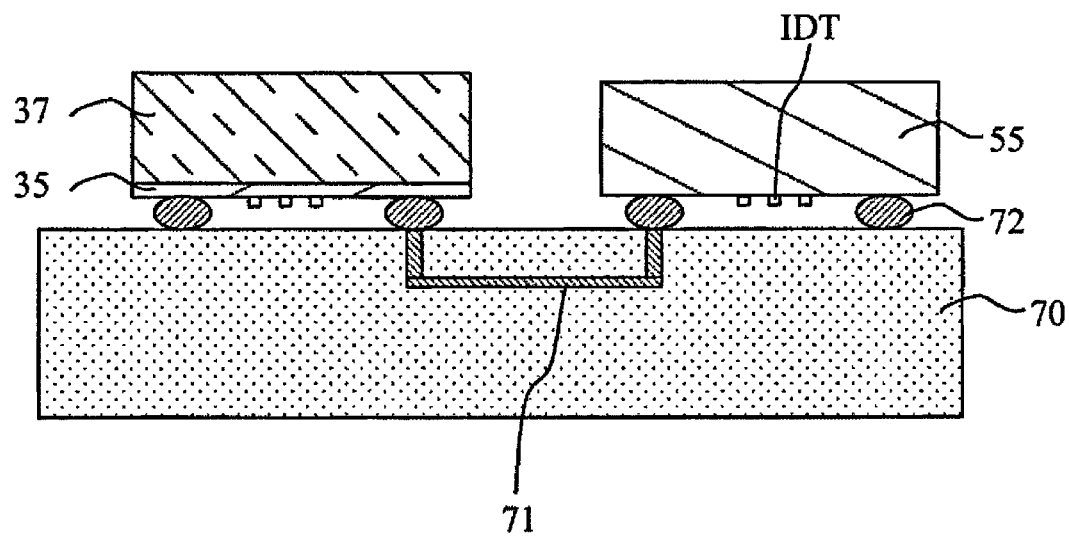
FIG. 5 is a sectional view of a major portion of a modification of the filter illustrated in FIG. 1.

In the example above, the description has been given of the case where a substrate made of a single material is used as each of the first piezoelectric substrate 35 and the second piezoelectric substrate 55. However, the thickness of the first piezoelectric substrate 35 and the thickness of the second piezoelectric substrate 55 may be decreased, and another support substrate may be adhered thereto. FIG. 5 is an enlarged sectional view of a major portion of a filter 1A.

In FIG. 5, the first piezoelectric substrate 35 is thin, and a support substrate 37 is directly or indirectly disposed on a surface of the first piezoelectric substrate 35 opposite to a side on which the ladder filter portion 3 is disposed. The support substrate 37 is not particularly limited as long as it has a strength to support the first piezoelectric substrate 35. For example, when a material having a smaller coefficient of linear expansion than the first piezoelectric substrate 35 is used, the support substrate 37 can suppress deformation of the first piezoelectric substrate 35 due to a temperature change and can increase a temperature-compensation effect. In this case, the thickness of the first piezoelectric substrate 35 may be set to be smaller than or equal to 20λ relative to λ described above.

When the thickness of the first piezoelectric substrate 35 is less than 1λ, leakage of an elastic wave in the substrate thickness direction can be suppressed and the elastic wave can be trapped in the first piezoelectric substrate 35. As a result, a filter with a low loss can be provided. In this case, an acoustic multilayer film in which a low acoustic velocity film and a high acoustic velocity are alternately stacked, or a joint layer made of an insulating material such as silicon oxide, for example, may be interposed between the first piezoelectric substrate 35 and the support substrate 37. To suppress an influence of a spurious of a bulk wave in the ladder filter portion 3, a material having a higher acoustic velocity than the first piezoelectric substrate 35 may be used as the support substrate 37. Examples of such a material of the support substrate 37 includes AlN, silicon nitride, a sapphire substrate, and a Si substrate.

On the other hand, the second piezoelectric substrate 55 is a normal LT substrate and does not have a support substrate or the like under the lower surface thereof.

As described above, in the filter 1A, the thicknesses of the first piezoelectric substrate 35 and the second piezoelectric substrate 55 are different. The first piezoelectric substrate 35 and the second piezoelectric substrate 55 are mounted on a mount substrate 70 with the surfaces on which the IDT electrodes are formed facing down. The ladder filter portion 3 and the multi-mode filter portion 5 are electrically connected to each other by a wiring pattern 71 located in the substrate 70. This enables the filter portions 3 and 5 to function as the filter 1A. In a plan perspective view, the wiring pattern 71 can also function as an inductor by having a path that is longer than a line segment that linearly links the ladder filter portion 3 and the multi-mode filter portion 5 to each other in the substrate 70. In this case, the passband of the filter 1A can be extended. The wiring pattern 71 may be located on an upper surface (mounting surface) of the substrate 70. In this example, the first piezoelectric substrate 35 and the second piezoelectric substrate 55 are mounted on the mount substrate 70 with mounting bumps 72 therebetween. However, the configuration is not limited to this.

With the filter 1A, loss-reduced electrical characteristics can be obtained in the filter portion (that is, the ladder filter portion 3) located on the side to which the antenna terminal 120 is connected. If a plurality of filters is connected in common to the antenna terminal 120 as illustrated in FIG. 3, characteristics of a resonator closest to the antenna terminal 120 influences insertion losses of the other filters. Therefore, the ladder filter portion 3 including the resonator closest to the antenna terminal 120 is formed on a composite substrate including the thin first piezoelectric substrate 35 and the support substrate 37 that supports the first piezoelectric substrate 35, so that the multi-filter having good temperature characteristics and implementing a reduced insertion loss can be provided.

As described above, in the multi-filter 100 illustrated in FIG. 3, a group of resonators of a filter having a small interval to an adjacent passband may be formed on the composite substrate including the first piezoelectric substrate 35 configured as a thin layer. In such a case, a frequency fluctuation of the filter can be suppressed, and a multi-filter with a high reliability can be obtained.

In the example above, the description has been given of the case where the first piezoelectric substrate 35 alone is configured as a thin layer as an example. However, the second piezoelectric substrate 55 may also be configured as a thin layer.

Modification

The first piezoelectric substrate 35 and the second piezoelectric substrate 55 may be made of different materials. For example, an LT substrate may be used as one of the first piezoelectric substrate 35 and the second piezoelectric substrate 55, and a lithium niobate (LN) substrate may be used as the other of the first piezoelectric substrate 35 and the second piezoelectric substrate 55.

When the ladder filter portion 3 is located right under the antenna terminal 120, the cut-angle of a piezoelectric crystal that constitutes the first piezoelectric substrate 35 may be made larger than that of the second piezoelectric substrate 55. This case enables the electrode thickness of the ladder filter portion 3 to be increased and thus can implement an enhanced electric power handling capability.

In the example above, the description has been given of the case where the first piezoelectric substrate 35 alone is configured as a thin layer as an example. However, the second piezoelectric substrate 55 or the piezoelectric substrate 140 may also be configured as a thin layer.

REFERENCE SIGNS LIST

1 . . . filter, 3 . . . ladder filter portion, 5 . . . multi-mode filter portion, 35 . . . first piezoelectric substrate, 55 . . . second piezoelectric substrate

The invention claimed is:
1. A filter comprising:
a ladder filter portion formed on a first piezoelectric substrate; and
a multi-mode filter portion connected to the ladder filter portion and formed on a second piezoelectric substrate different from the first piezoelectric substrate,
wherein the ladder filter portion and the multi-mode filter portion constitute a single passband, and
wherein an electrode thickness of the ladder filter portion is different from an electrode thickness of the multi-mode filter portion.

2. The filter according to claim 1, wherein a cut-angle of the first piezoelectric substrate is different from a cut-angle of the second piezoelectric substrate.

3. The filter according to claim 1, wherein a thickness of the first piezoelectric substrate is different from a thickness of the second piezoelectric substrate.

4. The filter according to claim 3,
wherein the ladder filter portion comprises a plurality of resonators connected in a ladder form,
wherein the resonators each include an IDT electrode having a plurality of electrode fingers arranged at a pitch p, and
wherein the thickness of the first piezoelectric substrate is less than or equal to 2p.

5. The filter according to claim 1, wherein
an end of the ladder filter portion is connected to an antenna terminal,
the ladder filter portion comprises resonators in each of which a plurality of electrode fingers are repetitively arranged,
the first piezoelectric substrate for the ladder filter portion has a thickness that is less than or equal to twice a pitch at which the electrode fingers are repetitively arranged, and
the ladder filter portion further comprises a support substrate directly or indirectly connected to the first piezoelectric substrate.

6. A multi-filter comprising:
a first filter as which the filter according to claim 1 is used; a second filter; and a third filter,
wherein a center frequency of a passband of the first filter takes a value between center frequencies of the second filter and the third filter, and
wherein the first substrate or the second substrate is shared with the second filter or the third filter.

7. The multi-filter according to claim 6, wherein the second filter is a ladder filter and shares the first substrate.

8. The multi-filter according to claim 6, wherein the third filter comprises a multi-mode filter and shares the second substrate.

9. A filter comprising:
a ladder filter portion formed on a first piezoelectric substrate; and
a multi-mode filter portion connected to the ladder filter portion and formed on a second piezoelectric substrate different from the first piezoelectric substrate,
wherein the ladder filter portion and the multi-mode filter portion constitute a single passband, and
wherein a cut-angle of the first piezoelectric substrate is different from a cut-angle of the second piezoelectric substrate.

10. The filter according to claim 9, wherein a thickness of the first piezoelectric substrate is different from a thickness of the second piezoelectric substrate.

11. The filter according to claim 9, wherein
an end of the ladder filter portion is connected to an antenna terminal,
the ladder filter portion comprises resonators in each of which a plurality of electrode fingers are repetitively arranged,
the first piezoelectric substrate for the ladder filter portion has a thickness that is less than or equal to twice a pitch at which the electrode fingers are repetitively arranged, and the ladder filter portion further comprises a support substrate directly or indirectly connected to the first piezoelectric substrate.

12. A multi-filter comprising:
a first filter as which the filter according to claim 9 is used;
a second filter; and a third filter,
wherein a center frequency of a passband of the first filter takes a value between center frequencies of the second filter and the third filter, and
wherein the first substrate or the second substrate is shared with the second filter or the third filter.

13. The multi-filter according to claim 12, wherein the second filter is a ladder filter and shares the first substrate.

14. The multi-filter according to claim 12, wherein the third filter comprises a multi-mode filter and shares the second substrate.

15. A filter comprising:
a ladder filter portion formed on a first piezoelectric substrate; and
a multi-mode filter portion connected to the ladder filter portion and formed on a second piezoelectric substrate different from the first piezoelectric substrate,
wherein the ladder filter portion and the multi-mode filter portion constitute a single passband, and
wherein a thickness of the first piezoelectric substrate is different from a thickness of the second piezoelectric substrate.

16. The filter according to claim 15,
wherein the ladder filter portion comprises a plurality of resonators connected in a ladder form,
wherein the resonators each include an IDT electrode having a plurality of electrode fingers arranged at a pitch p, and
wherein the thickness of the first piezoelectric substrate is less than or equal to 2p.

17. The filter according to claim 15, wherein
an end of the ladder filter portion is connected to an antenna terminal,
the ladder filter portion comprises resonators in each of which a plurality of electrode fingers are repetitively arranged,
the first piezoelectric substrate for the ladder filter portion has a thickness that is less than or equal to twice a pitch at which the electrode fingers are repetitively arranged, and
the ladder filter portion further comprises a support substrate directly or indirectly connected to the first piezoelectric substrate.

18. A multi-filter comprising:
a first filter as which the filter according to claim 15 is used; a second filter; and a third filter,
wherein a center frequency of a passband of the first filter takes a value between center frequencies of the second filter and the third filter, and
wherein the first substrate or the second substrate is shared with the second filter or the third filter.

19. The multi-filter according to claim 18, wherein the second filter is a ladder filter and shares the first substrate.

20. The multi-filter according to claim 18, wherein the third filter comprises a multi-mode filter and shares the second substrate.

* * * * *